United States Patent
Coufal et al.

(10) Patent No.: US 6,801,368 B2
(45) Date of Patent: Oct. 5, 2004

(54) SYSTEM FOR CONVERTING OPTICAL BEAMS TO COLLIMATED FLAT-TOP BEAMS

(75) Inventors: Hans J. Coufal, San Jose, CA (US); John A. Hoffnagle, San Jose, CA (US); Carl M. Jefferson, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/679,058

(22) Filed: Oct. 2, 2003

(65) Prior Publication Data

US 2004/0061952 A1 Apr. 1, 2004

Related U.S. Application Data

(60) Division of application No. 09/917,370, filed on Jul. 27, 2001, now Pat. No. 6,654,183, which is a continuation-in-part of application No. 09/461,365, filed on Dec. 15, 1999, now Pat. No. 6,295,168.

(51) Int. Cl.[7] .............................. G02B 13/18; G02B 3/02
(52) U.S. Cl. ........................ 359/708; 359/717; 359/754
(58) Field of Search ....................... 359/708–19, 793–5, 359/754

(56) References Cited

U.S. PATENT DOCUMENTS

| | | | |
|---|---|---|---|
| 3,476,463 A | | 11/1969 | Kreuzer |
| 4,327,972 A | * | 5/1982 | Brunsting .................... 362/335 |
| 4,941,721 A | | 7/1990 | Banton et al. ............... 359/217 |
| 5,099,358 A | | 3/1992 | Okazaki ....................... 359/503 |
| 5,293,269 A | | 3/1994 | Burkhart et al. ............ 359/719 |
| 5,315,095 A | * | 5/1994 | Marom et al. .......... 235/462.22 |
| 5,331,468 A | * | 7/1994 | Noethen ...................... 359/738 |
| 5,373,395 A | | 12/1994 | Adachi ........................ 359/652 |
| 5,572,367 A | | 11/1996 | Jung et al. ................... 359/708 |
| 6,075,650 A | | 6/2000 | Morris et al. ............... 359/641 |
| 6,195,208 B1 | * | 2/2001 | Ngoi et al. .................. 359/641 |

OTHER PUBLICATIONS

M. Arif et al., *Two–Element Refracting System for Annular Gaussian–to–Bessel Beam Transformation*, Applied Optics, vol. 37, No. 19, Jul. 1, 1998, pp. 4206–4209.

N. Nishi et al., *Control of the Laser Beam Irradiation Intensity Distribution Using Aspherical Multi Lens Array and Edge–Shaped Plates*, Technology Reports of the Osaka University, vol. 45, No. 2209, Apr. 1995, pp. 35–42.

K. Nemoto et al., *Laser Beam by Forming Fabricated Aspherical Mirror*, SPIE vol. 2375, pp. 103–108.

J. Kasinski et al., *Near–Diffraction–Limited Laser Beam Shaping with Diamond–Turned Aspheric Optics*, Optics Letters, vol. 22, No. 14, Jul. 15, 1997, pp. 1062–1064.

G. Erdei et al., *Single–Element Refractive Optical Device for Laser Beam Profiling*, SPIE, vol. 3100, 1997, pp. 400–412.

J. Hoffnagle et al., *Design and Performance of a Refractive Optical System that Converts a Gaussian to a Flattop Beam*, Applied Optics, vol. 39, No. 30, Oct. 20, 2000, pp. 5488–5499.

* cited by examiner

Primary Examiner—Jordan M. Schwartz
Assistant Examiner—Jessica Stultz
(74) Attorney, Agent, or Firm—Daniel E. Johnson

(57) ABSTRACT

An optical beam transformation system includes a first and a second optical element, each of which has a non-reentrant surface. The system transforms a substantially non-uniform optical input beam (such as a Gaussian) to a substantially uniform output beam. The first and second optical elements are arranged in either a Keplerian or Galilean configuration. The aspheric surface of the second optical element is related to the aspheric surface of the first optical element by a ray-tracing function that maps substantially all of an input light beam that is incident on the first optical element to a collimated output light beam that is output from the second optical element. Preferably, the output light beam has a Fermi-Dirac intensity distribution, and the ray-tracing function maps the input light beam to the output beam out to the $(1/e)^6$ intensity radius of the input light beam.

24 Claims, 6 Drawing Sheets

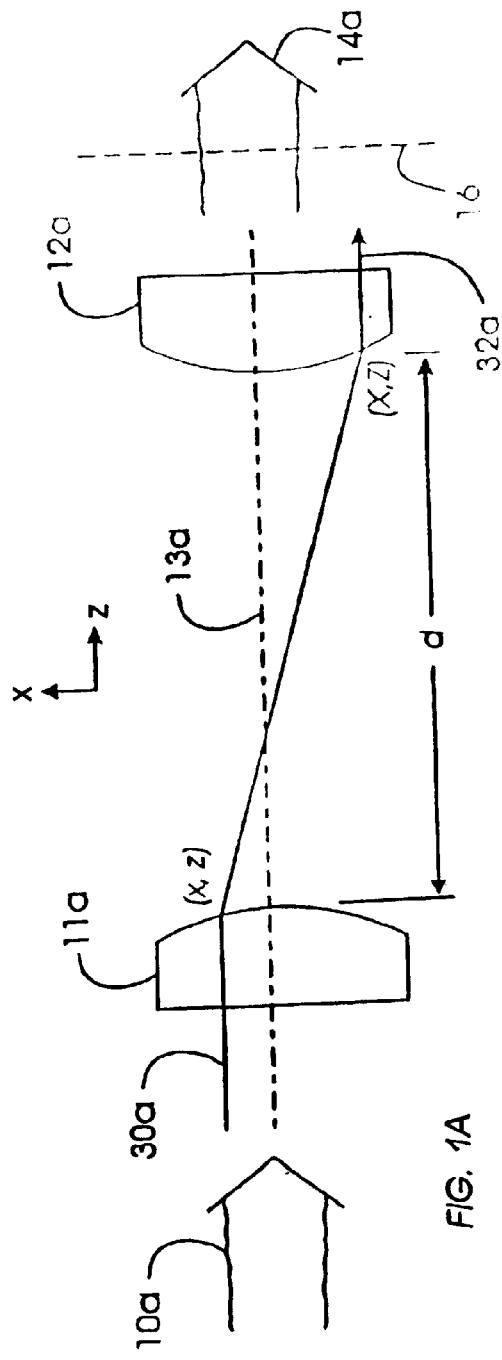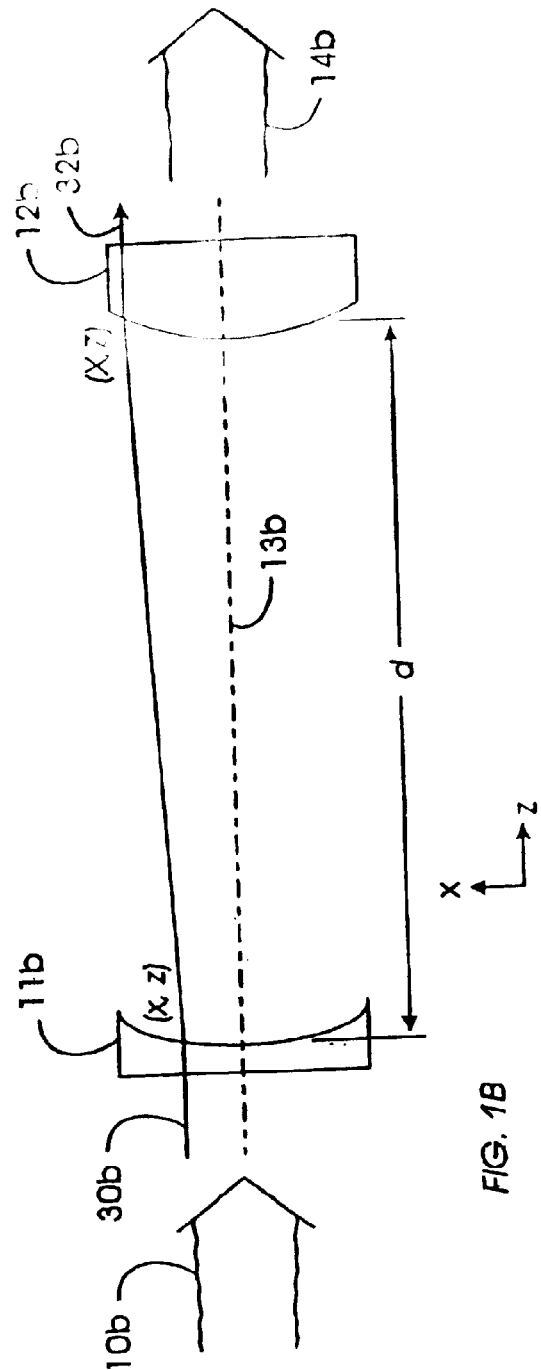

SYSTEM FOR CONVERTING OPTICAL BEAMS TO COLLIMATED FLAT-TOP BEAMS

This application is a divisional of U.S. application Ser. No. 09/917,370 titled "System for converting optical beams to collimated flat-top beams", filed Jul. 27, 2001 (which issued as U.S. Pat. No. 6,654,183 on Nov. 25, 2003 and is hereby incorporated by reference in its entirety, which in turn is a continuation-in-part of U.S. application Ser. No. 09/461,365 titled "Refractive optical system that converts a laser beam to a collimated flat-top beam", filed Dec. 15, 1999 (which issued as U.S. Pat. No. 6,295,168 on Sep. 25, 2001).

BACKGROUND OF THE INVENTION

1. Field of the Invention

The present invention relates to the field of optics. More particularly, the present invention relates to an optical system that transforms a beam having a substantially non-uniform intensity profile to a beam whose intensity profile is substantially uniform.

2. Description of the Related Art

Lasers emitting collimated beams of coherent light have many applications in optical science and technology, including lithography, spectroscopy, communications and display technology. Due to fundamental properties of light propagation in optical resonators, most lasers emit beams having a light intensity that is extremely inhomogeneous. Specifically, the light intensity of an emitted laser beam generally follows a Gaussian distribution $$I(r) = (2P/\pi w^2) e^{-2r^2/w^2} \qquad (1)$$

where I(r) denotes the optical power per unit area measured at a distance r from the axis of the beam, P denotes the total power of the beam, and w is the beam waist parameter, which sets the length scale over which the optical intensity declines from its maximum value to zero. The same distribution also describes, to a good approximation, the intensity profile of a beam that emerges from a single-mode optical fiber, such as is used extensively in the optical industry for conveying light.

For many applications, it is desirable that some area of interest be illuminated as uniformly as possible. For example, optical lithography, which is used to fabricate microelectronic devices, requires that the light fluence over an entire exposed region conform to tight tolerances. Laser users, therefore, frequently encounter the problem of transforming a beam having a Gaussian intensity profile to an output beam having optical intensity that is substantially uniform, e.g., a so-called flat-top profile having uniform intensity over a circular or rectangular region.

Many solutions have been proposed for transforming a Gaussian beam to a flat-top beam. All conventional solutions, however, have significant drawbacks. For example, the conceptually-simplest conventional method uses an element having radially-varying absorption for removing excess intensity from the center of a beam. Such an approach is inherently inefficient because it can be shown that, in the best case, the fraction of the incident beam power that emerges in the beam is 1/e, or approximately 37%. Moreover, in this conventional approach, the absorptive element only subtends the central part of the incoming beam, and has an aperture or other discontinuity located at a point where the light intensity is an appreciable fraction of the peak intensity. When using spatially coherent light sources, including most lasers, any aperture that truncates the beam also diffracts light into the central region of the beam. Accordingly, interference of the diffracted and transmitted light reduces the uniformity of the beam. Yet another drawback of this conventional approach is that stable, well-characterized absorptive materials are required, which are not available for the technologically-important ultraviolet wavelengths.

Another conventional approach uses lithographically or holographically fabricated phase gratings for reshaping a Gaussian beam by diffraction. Holographic gratings suffer from limited diffraction efficiency of only about 30%, as well as a lack of materials that are suitable for ultraviolet applications. Lithographically-fabricated phase gratings can have high efficiency, but are expensive to fabricate and only work as designed for a single wavelength. Additionally, it is exceedingly difficult to avoid diffraction into unwanted orders, leading to undesirable effects, such as non-uniformity of the output beam at high spatial frequencies and "hot spots" on the beam axis.

Conventional refractive solutions have been proposed that use either spherical or aspheric optical elements for aberrating and then recollimating a laser beam. The solutions with conventional, spherical optics are physically bulky and relatively inefficient because the spherical surfaces introduce limited aberrations. More compact and efficient conventional designs have been proposed that use either aspheric or gradient-index lenses. Nevertheless, use of a gradient index accomplishes essentially the same result as an aspheric surface, but with the drawback that no gradient-index glasses are available for ultraviolet applications. Prior art aspheric and gradient-index solutions have favored the use of a negative first element and a positive second element in a configuration resembling a Galilean telescope. Unfortunately, such designs require lenses that are difficult to fabricate. Fabrication problems are especially acute for the concave surface of the first lens in the Galilean design.

Another serious problem commonly encountered in the prior art is that the solutions to the aforementioned problem are generally only valid for the central region of an incident beam, thereby entailing an aperture or other discontinuity at a point where there is appreciable input beam intensity, on the order of $(1/e)^2$ times the peak intensity. As previously mentioned, truncating an input beam causes diffraction and interference fringes that reduce the uniformity of the output beam.

There is still a need to efficiently transform a non-uniform beam to a beam having uniform optical intensity.

SUMMARY OF THE INVENTION

In one embodiment of the present invention, there is provided an optical system that transforms a light beam having an axially-symmetric intensity distribution to a light beam having another axially-symmetric intensity distribution.

In a preferred embodiment of the invention, there is provided an optical system that comprises at least one optical element that includes a first and a second aspherical, non-planar, non-reentrant surface, in which the first and second surfaces are aligned along an optical axis and are configured to transform substantially all of an input beam incident on the first surface to an output beam propagating away from the second surface. The intensity profile of the input beam is expressible as a first function of a first coordinate times a second function of a second coordinate, in which the first and the second coordinates are independent of each other. The intensity profile of the output beam has a shape that is substantially different from that of the input beam, and the output beam has an intensity profile that is sigmoidal to reduce diffraction effects. In a preferred embodiment, the optical system comprises first and second optical elements that include the first and the second surfaces, respectively. Preferred embodiments are directed to either a Keplerian or a Galilean configuration of the surfaces. In a preferred embodiment, substantially all of the input beam is transformed for any wavelength within the wavelength range extending from 257 nm to 1550 nm. In one preferred embodiment, the first and second coordinates are represented by the Cartesian coordinates x and y, respectively, and each of the non-reentrant surfaces has a two-dimensional sag curve of the form $z(x,y)=z(x)+z(y)$.

In another preferred embodiment of the invention, there is provided an optical system that comprises at least one optical element that includes a first aspherical, non-planar, non-reentrant surface and a second aspherical, non-planar, non-reentrant surface, in which the first and second optical surfaces are aligned along an optical axis and configured to transform substantially all of a substantially non-uniform input beam incident on the first surface to an output beam propagating away from the second surface. The intensity profile of the input beam is expressible as a first function of a first coordinate times a second function of a second coordinate, in which the first and the second coordinates are orthogonal to each other. The intensity profile of the output beam is sigmoidal and has a shape that is substantially different from that of the input beam. The output beam includes a region over which the optical intensity is substantially uniform. This region includes most of the optical power in the output beam, with the intensity of the output beam outside the region varying gradually to substantially reduce diffraction effects. In a preferred embodiment, the optical system comprises first and second optical elements that include the first and the second surfaces, respectively. In preferred embodiments, the surfaces are arranged in either a Keplerian or a Galilean configuration. In one preferred embodiment, the first and the second coordinates are orthogonal spatial coordinates. In a preferred embodiment, the intensity profile of the input beam is symmetric about the optical axis. In one preferred embodiment, substantially all of the input beam is transformed for any wavelength within the wavelength range extending from 257 nm to 1550 nm. In preferred embodiments, the first and second coordinates are represented by the Cartesian coordinates x and y, respectively, and each of the non-reentrant surfaces has a two-dimensional sag curve of the form $z(x,y)=z(x)+z(y)$.

In one aspect of the invention, there is provided a method of transforming a beam of electromagnetic radiation. The method includes providing at least one optical element that includes a first and a second aspherical, non-planar, non-reentrant surface. An input optical beam of substantially non-uniform intensity is directed onto the first surface, in which the intensity profile of the input beam is expressible as a first function of a first coordinate times a second function of a second coordinate, with the first and second coordinates being independent of each other. The method further includes transforming substantially all of the input beam into an output beam that propagates away from the second surface, in which the aspherical surfaces are selected to perform said transforming. The output beam includes a central region over which the optical intensity is substantially uniform, with the central region including most of the optical power in the output beam, and the intensity of the output beam outside the region varies gradually to substantially reduce diffraction effects. In a preferred implementation of the method, said at least one optical element includes a first and a second optical element, with each of the first and the second optical elements having at least one aspherical, non-planar, non-reentrant surface, in which the method further comprises aligning the first and the second optical elements along an optical axis. In one preferred implementation, the first and second coordinates are orthogonal spatial coordinates, and the intensity of the output beam outside the central region varies gradually to substantially reduce diffraction effects.

In another aspect of the invention, there is provided a method of designing an optical system for transforming a first optical beam to a second optical beam, in which the first and second optical beams have respective intensity profiles. The method includes expressing the intensity profile of the first optical beam as a first function times a second function, and expressing the intensity profile of the second optical beam as a third function times a fourth function, in which each of the first and third functions are functions of a first spatial coordinate, and each of the second and fourth functions are functions of a second spatial coordinate, with the first and the second spatial coordinates being orthogonal to each other. The method further includes defining an optical axis along a spatial coordinate orthogonal to the first and second spatial coordinates along which two aspherical, non-planar, non-reentrant surfaces are to be aligned. The method includes constructing a ray-tracing function for the first spatial coordinate using the first and third functions, and constructing a ray-tracing function for the second spatial coordinate using the second and fourth functions. The ray-tracing functions are used to calculate sag values for each of the surfaces, in which each sag value is expressible as a sum of contributions that depend on the first and second spatial coordinates, respectively. In a preferred implementation of the method, the first and the second surfaces form part of first and second optical elements, respectively. The method allows for aspherical, non-planar, non-reentrant, surfaces to be arranged in either a Keplerian or a Galilean configuration. In a preferred implementation, the first optical beam is substantially non-uniform, such as a Gaussian. In one preferred implementation, the intensity profile of the second optical beam is substantially rectangular, and is preferably substantially uniform. The second output beam may advantageously have an intensity distribution selected from the distributions consisting of Fermi-Dirac, super Gaussian, and flattened Gaussian. The integrated intensity of the second output beam may advantageously be at least 90% that of the first optical beam. In a preferred implementation, the method further includes manufacturing the optical system.

BRIEF DESCRIPTION OF THE DRAWINGS

The present invention is illustrated by way of example and not limitation in the accompanying figures in which like reference numerals indicate similar elements and in which:

FIGS. 1A and 1B show Galilean and Keplerian beam reshaper configurations, respectively, that include optical elements having aspheric surfaces designed to transform a given input beam into a desired output beam.

DETAILED DESCRIPTION

Figure 2:
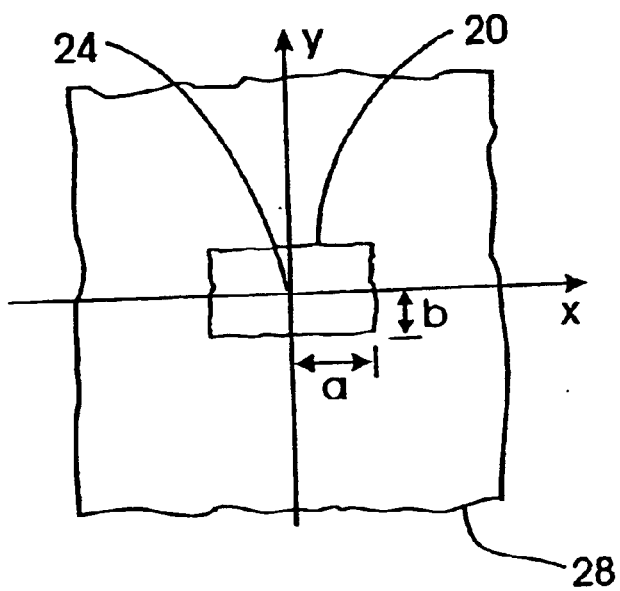
FIG. 2 shows, for a given output beam, an intensity profile perpendicular to the direction of propagation of the beam having a rectangular central region of substantially constant intensity.

The present invention provides an optical system for transforming a light beam having any axially-symmetric intensity distribution to a light beam having another axially-symmetric distribution, e.g., the transformation of a Gaussian beam to a flat-top beam. More generally, the present invention provides an optical system for transforming an input beam to an output beam in which the intensity profile of the input beam is expressible as a first function of a first coordinate times a second function of a second coordinate (with the first and the second coordinates being independent of each other), and the intensity profile of the output beam has a shape that is substantially different from that of the input beam. For example, the first and second coordinates can be spatial coordinates such as the x and y axes of the Cartesian coordinate system. (The terms "light", "laser", and "optical" are used broadly herein to encompass electromagnetic radiation in both the visible and invisible portions of the spectrum, including the ultraviolet and the infrared.) In one preferred embodiment, a uniform intensity laser beam is generated from a Gaussian laser beam by radially redistributing the energy in the beam by introducing aberrations into the incident waveform using a first aspheric refractive element, and by removing the wavefront path differences of the redistributed rays and recollimating the beam using a second aspheric element.

Preferred embodiments of the present invention have advantages over conventional approaches in that they are particularly efficient, nearly achromatic, practical for wavelengths from the deep ultraviolet to the far infrared, free of apertures that would otherwise cause diffraction of a coherent beam, and are easily manufacturable. These advantages are achieved using a design that takes into account essentially all the energy in the incoming beam (without truncating the beam at a radius for which there is appreciable intensity) and by using an optical configuration that requires only non-reentrant (e.g., concave or convex) aspheric surfaces, which are especially practical for fabrication. In preferred embodiments, substantially all (e.g., 90, 95, 99% or more) of the input beam is transformed into the output beam.

In preferred embodiments of the invention, non-reentrant aspheric elements are arranged in a Keplerian or Galilean configuration. Such a configuration reduces fabrication difficulties associated with reentrant surfaces, such as those used in the prior art. Consequently, preferred embodiments can be fabricated at a reasonable cost, whereas a conventional design having a reentrant element would be difficult to make.

Additionally, preferred embodiments of the present invention map essentially all of the input beam into an output beam having a large region of nearly uniform intensity around the center of the output beam; the output beam includes a well-controlled roll-off of intensity at distances further away from the optical axis. While any physically realizable apparatus must have a finite aperture, preferred embodiments of the present invention allow the aperture to be arbitrarily large. Consequently, the aperture intercepts extremely little optical intensity, thereby introducing negligible diffraction effects. For example, a preferred embodiment of the present invention accepts an input beam out to the $1/e^6$ intensity radius of the beam, meaning that 99.7% of the incident optical power is controlled through the optical system without striking an aperture.

The present invention provides a computationally simple method for calculating the required aspheric surfaces. In a preferred embodiment of the present invention, the output is expressible as a Fermi-Dirac function, but many other functions are possible. For example, a raised cosine or other functions found in the windowing of spectral distributions in digital signal processing, the super-Gaussian, and the flattened Gaussian profiles, which are of relevance to laser beam propagation, can be used.

The combination of non-reentrant surfaces and large apertures used in preferred embodiments of the present invention provides many important advantages not found in conventional designs. For example, the aspheric surfaces in preferred embodiments herein advantageously have a monotonical radial dependence, that is, a monotonic taper along any radially outward direction away from the optical axis, so that the surface is "non-reentrant". Consequently these aspheric surfaces may be fabricated from high-quality optical materials, such as fused silica, optical glass, polymers, or crystalline materials (such as $CaF_2$, Ge, ZnSe, and other II-VI materials). Moreover, preferred designs of the present invention can be implemented at any wavelength for which a transparent material is available, including the technologically-important ultraviolet and infrared regions. Through the use of materials having low dispersion, such as fused silica, it is possible to design a nearly achromatic system. For instance, preferred embodiments of the present invention perform essentially equally well within the entire wavelength range from 257 nm (ultraviolet) to 1550 nm (infrared) with only a single focus adjustment (i.e., one aspheric surface may be moved or translated along the optical axis with respect to another aspheric surface). Other embodiments are designed to work over the wavelength range extending from 157 nm to 10.6 or even 12 micrometers. Therefore, a single fabrication process can produce optics suitable for many applications. The output beams in preferred embodiments herein have intensity profiles in which approximately 65% or more of the output beam intensity is confined to a central region whose intensity is substantially uniform (e.g., uniform to within 5 or 10%), with this central region including most of the optical power in the output beam, and with the intensity of the output beam outside the central region varying gradually to substantially reduce diffraction effects. The preferred embodiments are designed in such a way that no apertures or other optical discontinuities exist that could diffract appreciable optical power into the central, uniform region of the beam.

In the following description, a light source such as a laser is assumed to emit a collimated beam of light having a particular intensity distribution transverse to the beam's direction of propagation. FIGS. 1A and 1B illustrate Keplerian and Galilean configurations, respectively, in which respective collimated input beams 10a and 10b pass through respective pairs of input and output aspheric lenses 11a, 12a and 11b, 12b. Alternatively, a single rod-like lens (not shown) having an aspheric surface at each end may be used. The input and output lenses of FIGS. 1A and 1B are advantageously aligned along respective optical axes 13a and 13b. The output beams 14a and 14b are advantageously collimated and propagate away from the aspheric lenses 11b, 12b, respectively. The output beam 14a, 14b preferably has an intensity profile whose shape is substantially different from the shape of the input beam 10a, 10b. For example, the input beam 10a, 10b may be Gaussian and therefore substantially non-uniform. On the other hand, the shape of the output beam 14a, 14b is substantially uniform, and may be rectangular in shape. The output beam 14a, 14b advantageously has a sigmoidal intensity distribution, such as Fermi-Dirac, super Gaussian, or flattened Gaussian.

The respective aspheric surfaces of lenses 11a, 11b and 12a, 12b each advantageously have a monotonical radial dependence, that is, the thickness of the lens changes (increases or decreases) monotonically along any ray that is perpendicular to and emanates from the optical axis 13a, 13b. In this sense, the aspheric surfaces herein can be regarded as "non-reentrant". Those surfaces of lenses 11a, 11b and 12a, 12b that are not aspheric are preferably plano, but can alternatively be spherical without significantly changing the design of the optical system. The lenses 11a, 11b and 12a, 12b are preferably chosen to be made of the same material, and thus have the same index of refraction. Alternatively, however, the object lenses 11a, 11b and image lenses 12a, 12b may made of different materials and have different refractive indices.

A coordinate system can be defined in which the z-axis is parallel to the propagation direction of the beam, as indicated in FIGS. 1A and 1B. For those embodiments for which the input beam enjoys axially symmetry, r may be used to denote the (radial) distance from the optical axis (z-axis), and the optical intensity at any point in the beam can then be described by a function f(r). More generally, the invention is directed to transforming an input beam whose intensity f can be expressed as a product of two functions $f_1$ and $f_2$, in which $f_1$ and $f_2$ each depend upon a different coordinate, e.g., spatial dimension. In preferred embodiments, these two coordinates are orthogonal, such as the x and y dimensions of a Cartesian coordinate system (or, for example, the r and θ dimensions of a polar coordinates system). Thus, in some preferred embodiments, $f_1=f_1(x)$ and $f_2=f_2(y)$, and in other preferred embodiments, $f_1=f_1(r)$ and $f_2=f_2(\theta)$. Accordingly, the transverse (two-dimensional) intensity distribution of the input beams 11a, 11b can be advantageously expressed as a function that is separable into two, one-dimensional (1-D) functions. The general beam transformation problem considered herein is to find an optical system that transforms the collimated input beam 11a (11b) having a transverse intensity distribution f into a collimated output beam 12a (12b) having another intensity distribution g that can likewise be expressed as a product of two functions $g_1$ and $g_2$, in which $g_1$ and $g_2$ depend on the same coordinates as $f_1$ and $f_2$, respectively. In this manner, optical systems may be designed for input and output beams that do not necessarily enjoy axial symmetry, as is commonly encountered in the art.

The input intensity distribution can be assumed to be normalized. For example, in the case of azimuthal symmetry, $$2\pi \int_0^\infty f(r)r\,dr = 1. \tag{2}$$

Furthermore, if the intensity distribution function of the input beam is separable in Cartesian coordinates, then $$\int_{-\infty}^\infty f_1(x)dx = \int_{-\infty}^\infty f_2(y)dy = 1. \tag{3}$$

In this case, it is convenient to express the output intensity distribution as a normalized function, that is, $$\int_{-\infty}^\infty g_1(x)dx = \int_{-\infty}^\infty g_2(y)dy = 1. \tag{4}$$

Thus, the normalization condition for the output intensity distribution function can be described by equations analogous to eqs. (3) and (4) in the cases of azimuthal symmetry and separability into Cartesian coordinates, respectively.

Preferred embodiments of the present invention depart from conventional approaches for generating a power redistribution by avoiding the use of absorptive optics or apertures that would intercept appreciable optical input intensity. Preferred embodiments of the present invention further provide that the output intensity distribution is continuous, in contrast to the step-function distributions that are often used in connection with conventional approaches. The use of a controlled intensity roll-off at the edge of the output beam herein is extremely valuable for reducing diffraction effects and thereby increasing the depth-of-field. This can be accomplished by selecting the output intensity distribution to be, for example, Fermi-Dirac, super Gaussian, flattened Gaussian, or another sigmoidal distribution, as discussed below.

Figure 3A:
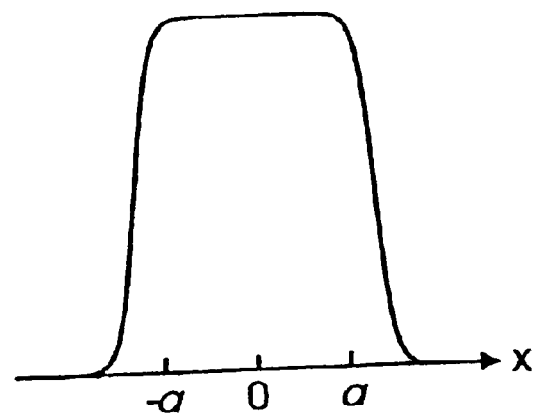
FIG. 3 shows sigmoidal intensity profiles along the x and y axes for the rectangular intensity profile of FIG. 2.
Figure 3B:
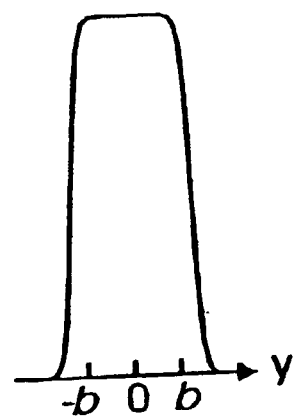

Before considering specific designs in detail, some quantitative figures of merit are introduced. A transverse (cross sectional) intensity profile of the output beam 14a taken along the plane perpendicular to the z-axis and passing through the dotted line 16 is shown in FIG. 2. The x and y dimensions are taken to be independent of and orthogonal to each other. The output beam 14a includes a central region 20 about the optical axis 13a which passes through the point 24. The central region 20 is rectangular and has an intensity distribution that is nearly constant. Most of the output beam's power is contained in this region 20, and the outer extent of the output beam (taken in this example to be the power level that is 1% of the beam's maximum) is indicated by the outer perimeter 28. The intensity profile of the beam 14a along the x and y dimensions is shown in FIGS. 3A and 3B, respectively, in which intensity is displayed along the vertical axis. The intensity profile for the rectangular shaped output beam 14a in FIG. 2 is considered to be sigmoidal in the sense that there exists at least one ray perpendicular to the optical axis 13a along which the optical intensity is substantially constant near the optical axis and gradually tapers to zero to substantially reduce diffraction effects (see FIGS. 3A and 3B), thereby defining a central region 20 over which the optical intensity is substantially constant, with the central region containing most of the output beam power.

Let $g_{min}$ and $g_{max}$, respectively, denote the minimum and maximum values of g within the rectangular region 20. The absolute uniformity of the output beam can be defined as $$U = g_{min}/g_{max}. \tag{5}$$

The efficiency η of the system is defined as the fraction of the total beam power contained within the region 20.

Since $g_1$ and $g_2$ are taken to be normalized, the efficiency $\eta$ can be written as $$\eta = \int_{-a}^{a} g_1(x)dx \int_{-b}^{b} g_2(y)dy. \tag{6}$$

Both U and $\eta$ range from 0 to 1, with larger values being more desirable. The uniformity U and the efficiency $\eta$ are not properties of the function g alone, but also depend on the spatial extent of the chosen region 20. One can calculate, for any region 20, the values of U and $\eta$, e.g., through numerical integration.

By far the most important intensity distribution of practical interest for the input beam 10a, 10b is the Gaussian distribution, $$f=(2/\pi w^2)e^{-2r^2/w^2}=(2/\pi w^2)e^{-2x^2/w^2}e^{-2x^2/w^2}. \tag{7}$$

which is separable in both cylindrical and Cartesian coordinates, as indicated in Eq. (7) above. Such an intensity distribution closely describes the observed output of many gas lasers, solid-state lasers, and the circularized output of diode lasers, as well as the radiation pattern of single-mode optical filters used for conveying light for optical communications and other applications. A Gaussian distribution also approximates the central lobe of a spatially filtered beam, which is often used in holography.

The choice of an output intensity distribution for the output beams 14a, 14b is more problematic. In the literature, functions of the type $$g(R)=\text{constant}, 0<R<a, \tag{8}$$

are often found, with g(R) being undefined or 0 for R>a. Such an approach is likely to lead to unphysical discontinuities at R=a. To avoid such a problem, the present invention provides a continuous, sigmoidal function g(R) that satisfies the normalization condition of Eq. (4). Subject to these constraints, there is considerable freedom in choosing the function g. For example, even a piecewise definition for the output intensity distribution, such as a spline, is possible. Additionally, as shown in FIG. 2, the output beam may be chosen to have an intensity profile whose shape is substantially rectangular. Other analytic forms may be used, e.g., the Fermi-Dirac, the super-Gaussian, and the flattened Gaussian.

Once the input intensity distribution is known and the output intensity distribution has been chosen to satisfy the uniformity U and the efficiency $\eta$ requirements for a particular application, the aspherical surfaces may be calculated in accordance with the following methodology. The separability property of the input and output intensity distributions (in which $f=f_1 \times f_2$ and $g=g_1 \times g_2$, as discussed above) implies that the intensity transformation problem can be decomposed into two independent one-dimensional transformations (e.g., one for each of the two transverse x and y coordinates). One can begin by considering an arbitrary ray 30a (30b), as shown in FIGS. 3A (3B) that enters the optical system at some distance (the input ray height) from the optical axis 13a (13b) and exits the optical system at some other distance from the optical axis (the output ray height). The input and output beams 10a, 14a (10b, 14b) are assumed to be collimated, so that the rays of these beams 10a, 14a (10b, 14b) are parallel to the optical axis 13a (13b). Accordingly, the geometry of any ray is specified by the input and output ray heights. Given the input and output distributions, the output ray height corresponding to any arbitrary input ray height can be computed from energy conservation, i.e., the requirement that the energy flux in that portion of the beam between the optical axis 13a (13b) and the input ray 30a (30b) is the same as the energy flux in the output beam 14a (14b) between the optical axis 13a (13b) and the corresponding output ray 32a (32b). The functional relation of the output ray height on the input ray height is denoted as the ray-tracing function.

For concreteness, consider the reshaping of an input beam (e.g., 10a or 10b) whose intensity distribution function is separable in Cartesian coordinates. The reshaping involves transforming $f_1(x)$ to $g_1(x)$. Likewise, the problem of transforming the y-dependent portion of the intensity distribution function can be solved using appropriate functions $f_2$ and $g_2$. Either a Keplerian or a Galilean optical system (as shown in FIGS. A and 1B, respectively) may present itself as the preferred solution. Note that in the Galilean case X>0 for x>0, while in the Keplerian case X<0 for x>0. The lens system transforms that part of the input beam within the areal region extending from the optical axis to the value x onto that part of the output beam within the areal region extending from the optical axis to the value X at the output. It then follows from energy conservation that $$\int_0^x f(s)ds = \pm \int_0^X g(s)ds, \tag{9}$$

where the "+" sign applies to the Galilean case and the "−" sign to the Keplerian case. This relation implicitly determines the ray-tracing function h, which can be defined as $$X=h(x), \tag{10}$$

and can be solved numerically for any given $f_1$ and $g_1$. The inverse function of h(x) is denoted by $h^{-1}(x)$, in which $h^{-1}[h(x)]=x$.

The constraints provided by the ray-tracing function, the requirement of collimated input and output beams, and Snell's law are sufficient to completely determine the sag values $z_1$ and $Z_1$ of the aspherical surfaces of the lenses 11a (11b) and 12a (12b), respectively. $Z_1$ and $z_1$ can each be expressed as a sum of two terms that depend on respective contributions from x and y:

$$z_1(x,y)=z_x(x)+z_y(y) \tag{11}$$

$$Z_1(X,Y)=Z_x(X)+Z_y(Y) \tag{12}$$

in which the analysis for the y-dimension proceeds in a fashion analogous to that for the x-dimension. Likewise, the analysis can be applied to non-Cartesian pairs of coordinates, e.g., the orthogonal coordinates r and $\theta$. In preferred embodiments, each of $z_1$ and $Z_1$ is a monotonic function with respect to both x and y.

The computation can be carried out numerically, with the aid of commercially available ray-tracing software, or analytically. Of the several analytical treatments available, the most lucid may be that described in U.S. Pat. No. 3,476,463 to Kreuzer, which is hereby incorporated by reference. Adapting the notation to conform to the example above, one can show that the aspherical surfaces $z_1$ and $Z_1$ can be described as a sum (see eqs. 11 and 12) of single integral equations of the form:

$$z_x(x) = \int_0^x \text{sgn}[h(s)-s]\left\{(n^2-1)+\left[\frac{(n-1)d}{h(s)-s}\right]^2\right\}^{-1/2} ds, \tag{13}$$

$$Z_x(X) = \int_0^X \text{sgn}[s - h^{-1}(s)]\left\{(n^2 - 1) + \left[\frac{(n-1)d}{h^{-1}(s) - s}\right]^2\right\}^{-1/2} ds. \quad (14)$$

in which the contributions $z_y(y)$ and $Z_y(Y)$ can be expressed by equations analogous to eqs. (13) and (14) above. Here n denotes the index of refraction (assumed in this example to be the same for both lenses) and d denotes the separation of the aspheric surfaces along the optical axis. The square root is taken to be positive, with $\text{sgn}(\xi)$ being +1 for $\xi \geq 0$, and −1 for $\xi < 0$.

Equations 13 and 14 have been modified from the expressions of Kreuzer to unambiguously clarify the sign of the square root in the integrand. No confusion exists in the case of the Keplerian design, for which $\text{sgn}[h(s)-s]$ is always −1 when s>0, since h(s)<0 for all s>0, as noted above. However, a Galilean design may have $\text{sgn}[h(s)-s]=-1$ or $\text{sgn}[h(s)-s]=1$, depending on the value of s and the specific choice of $f_1$ and $g_1$. This has a bearing on the design of non-reentrant beam reshaping optics: if [h(s)−s] does not change sign for s>0, a condition that is satisfied by all Keplerian but only some Galilean designs, then the aspheric surfaces are non-reentrant, whereas if [h(s)−s] does change sign for s>0, as for some Galilean designs, then the aspheric surfaces are reentrant. Reentrant surfaces are less desirable because of the difficulties associated with their manufacture.

Reshaping optics for axially symmetric beams can be designed using similar methodology, as now discussed. In the axially symmetric case, both Galilean and Keplerian solutions are possible, except that now the transverse coordinates of the generic ray are given simply by the input and output radii r and R, respectively. The equations for the aspherical surfaces are given by Equations 13 and 14 after substituting r and R for x and X, respectively. However, the equations that define the ray-tracing function in the axially symmetric case must be modified to properly reflect energy conservation, as follows:

$$\int_0^r f(s)s\,ds = \int_0^R g(s)s\,ds, \quad (15)$$

in which the ray tracing function h is defined by $$R = \pm h(r), \quad (16)$$

and $$r = \pm h^{-1}(R) \quad (17)$$

Here the positive sign applies to the Galilean geometry and the negative sign to the Keplerian geometry. Although Kasinski and Burnham (see J. J. Kasinski and R.L. Burnham, Optics Letters, "Near-diffraction-limited laser beam shaping with diamond-turned aspheric optics", vol. 22, no. 14, Jul. 15, 1997, pp. 1062–1064) describe a reentrant-type optically system for reshaping axially symmetric input (in which a Gaussian input beam is transformed to a super Gaussian output beam), it was not understood until now that a Gaussian to sigmoidal beam transformation can be effect with a non-reentrant Galilean design.

The design methodology described herein was implemented for a choice of parameters that would be of interest to a laboratory experiment. The input beam intensity distribution was assumed to be Gaussian having $$w = 2.366 \text{ mm}. \quad (18)$$

To substantially reduce diffraction effects, the output beam intensity profile was chosen to be a sigmoidal, in particular, a Fermi-Dirac distribution:

$$g(R) = g_0 \Big/ \left[1 + e^{\left(\frac{R-R_0}{W}\right)}\right], \quad (19)$$

in which $$R_0 = 3.25 \text{ mm} \quad (20)$$

and $$W = 0.2 \text{ mm}. \quad (21)$$

Figure 4:
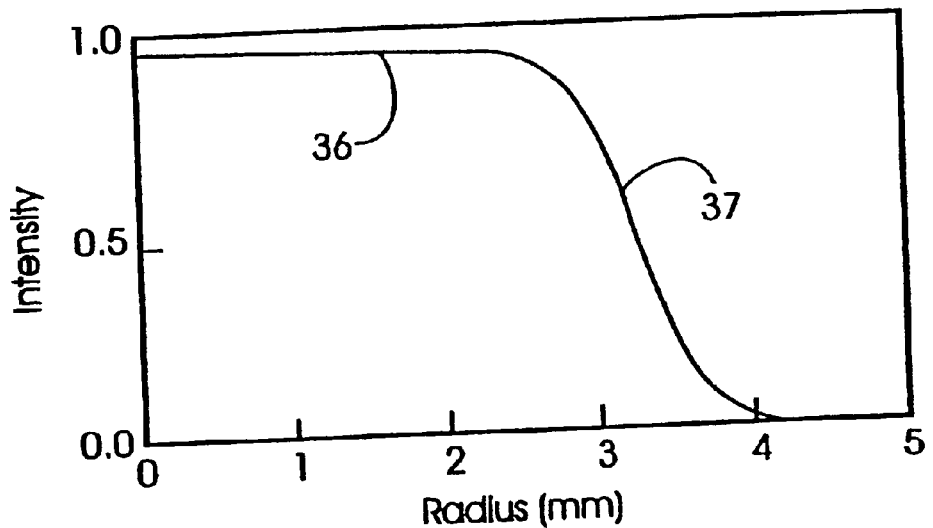
FIG. 4 is a graph showing a relative intensity distribution for a Fermi-Dirac distribution having $R_0=3.25$ mm and $W=0.2$ mm.

FIG. 4 is a graph showing the resulting relative intensity distribution $g(r)/g_0$ for a Fermi-Dirac distribution having $R_0 = 3.25$ mm and $W = 0.2$ mm. In FIG. 4, a large region of nearly constant intensity is shown at 36 and a sharp, but smooth roll-off is shown at 37. The shape of the relative intensity distribution shown in FIG. 4 is determined solely by the ratio $W/R_0$.

Figure 5:
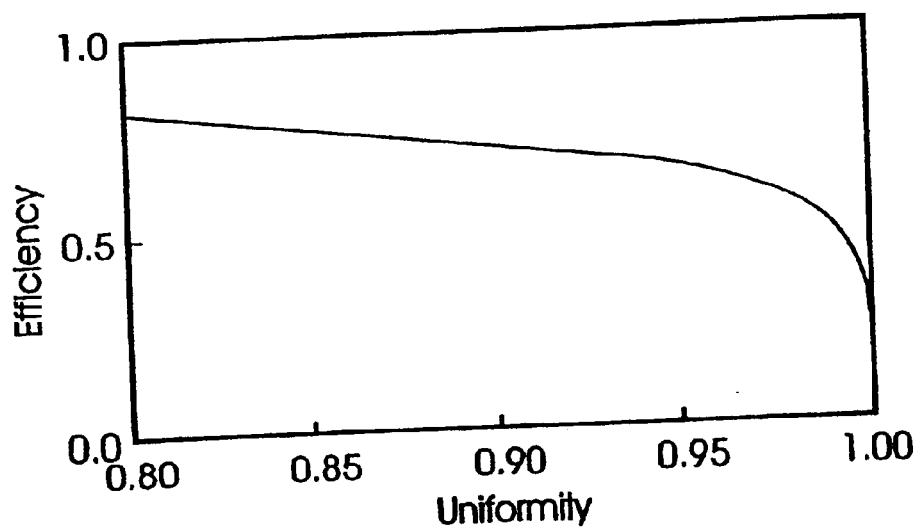
FIG. 5 is a graph showing the relationship between efficiency and uniformity for a selected Fermi-Dirac function.

Because of the continuous roll-off, the values of uniformity U and efficiency $\eta$ are functions of the radius a of the illuminated area. FIG. 5 shows the relationship between efficiency and uniformity for the Fermi-Dirac function used for FIG. 4. FIG. 5 shows that 65% efficiency is possible with 95% uniformity, and 72% efficiency is possible with 90% uniformity.

In practice, the intensity distributions must be truncated at some point, so an input aperture of 4.056 mm radius and a corresponding output aperture of 4.06 mm radius were chosen. At this particular radius, the input intensity is reduced by a factor of $e^{-6}$ from its on-axis value, and 99.7% of the total input beam power is redistributed in the output beam. Consequently, aperture effects are not a concern.

The required aspheric surfaces were calculated assuming both lenses to be composed of fused silica, separated by 150 mm, and for a wavelength of 532 nm. The resulting sag values for z(r) (Asphere 1) and Z(R) (Asphere 2) are presented in Table I. The corresponding lenses for this embodiment are arranged as illustrated in FIG. 1A, with the aspheric surfaces facing each other. The resulting surfaces are easy to manufacture, as convex surfaces are considerably simpler to grind and polish than are concave surfaces. Of additional significance, however, is the unexpected result that a positive first element results in surfaces having only small deviations less than 20 micrometers from sphericity.

TABLE I

| Radius (mm) | Asphere 1 (mm) z(r) | Asphere 2 (mm) Z(R) |
|---|---|---|
| 0.00 | 0.000000 | 0.000000 |
| 0.05 | −0.000053 | 0.000027 |
| 0.10 | −0.000214 | 0.000109 |
| 0.15 | −0.000481 | 0.000246 |
| 0.20 | −0.000854 | 0.000438 |
| 0.25 | −0.001334 | 0.000684 |
| 0.30 | −0.001919 | 0.000985 |
| 0.35 | −0.002609 | 0.001340 |
| 0.40 | −0.003404 | 0.001751 |
| 0.45 | −0.004303 | 0.002216 |
| 0.50 | −0.005305 | 0.002737 |
| 0.55 | −0.006409 | 0.003312 |
| 0.60 | −0.007614 | 0.003943 |
| 0.65 | −0.008920 | 0.004628 |
| 0.70 | −0.010325 | 0.005369 |
| 0.75 | −0.011827 | 0.006165 |

TABLE I-continued

| Radius (mm) | Asphere 1 (mm) z(r) | Asphere 2 (mm) Z(R) |
|---|---|---|
| 0.80 | −0.013427 | 0.007017 |
| 0.85 | −0.015122 | 0.007924 |
| 0.90 | −0.016911 | 0.008887 |
| 0.95 | −0.018793 | 0.009906 |
| 1.00 | −0.020767 | 0.010980 |
| 1.05 | −0.022830 | 0.012111 |
| 1.10 | −0.024982 | 0.013297 |
| 1.15 | −0.027220 | 0.014541 |
| 1.20 | −0.029544 | 0.015840 |
| 1.25 | −0.031952 | 0.017197 |
| 1.30 | −0.034442 | 0.018610 |
| 1.35 | −0.037013 | 0.020081 |
| 1.40 | −0.039662 | 0.021609 |
| 1.45 | −0.042390 | 0.023194 |
| 1.50 | −0.045193 | 0.024838 |
| 1.55 | −0.048071 | 0.026539 |
| 1.60 | −0.051022 | 0.028300 |
| 1.65 | −0.054044 | 0.030118 |
| 1.70 | −0.057137 | 0.031997 |
| 1.75 | −0.060299 | 0.033934 |
| 1.80 | −0.063529 | 0.035932 |
| 1.85 | −0.066825 | 0.037990 |
| 1.90 | −0.070186 | 0.040108 |
| 1.95 | −0.073612 | 0.042288 |
| 2.00 | −0.077100 | 0.044530 |
| 2.05 | −0.080651 | 0.046834 |
| 2.10 | −0.084264 | 0.049201 |
| 2.15 | −0.087937 | 0.051631 |
| 2.20 | −0.091669 | 0.054126 |
| 2.25 | −0.095461 | 0.056686 |
| 2.30 | −0.099311 | 0.059311 |
| 2.35 | −0.103219 | 0.062004 |
| 2.40 | −0.107185 | 0.064764 |
| 2.45 | −0.111207 | 0.067593 |
| 2.50 | −0.115285 | 0.070492 |
| 2.55 | −0.119420 | 0.073462 |
| 2.60 | −0.123610 | 0.076504 |
| 2.65 | −0.127856 | 0.079621 |
| 2.70 | −0.132157 | 0.082813 |
| 2.75 | −0.136513 | 0.086083 |
| 2.80 | −0.140923 | 0.089432 |
| 2.85 | −0.145388 | 0.092862 |
| 2.90 | −0.149908 | 0.096376 |
| 2.95 | −0.154482 | 0.099975 |
| 3.00 | −0.159111 | 0.103662 |
| 3.05 | −0.163794 | 0.107440 |
| 3.10 | −0.168531 | 0.111310 |
| 3.15 | −0.173323 | 0.115275 |
| 3.20 | −0.178169 | 0.119337 |
| 3.25 | −0.183070 | 0.123498 |
| 3.30 | −0.188025 | 0.127760 |
| 3.35 | −0.193034 | 0.132123 |
| 3.40 | −0.198098 | 0.136589 |
| 3.45 | −0.203218 | 0.141158 |
| 3.50 | −0.208392 | 0.145831 |
| 3.55 | −0.213621 | 0.150608 |
| 3.60 | −0.218905 | 0.155487 |
| 3.65 | −0.224245 | 0.160469 |
| 3.70 | −0.229640 | 0.165552 |
| 3.75 | −0.235091 | 0.170737 |
| 3.80 | −0.240597 | 0.176020 |
| 3.85 | −0.246160 | 0.181403 |
| 3.90 | −0.251779 | 0.186883 |
| 3.95 | −0.257454 | 0.192459 |
| 4.00 | −0.263186 | 0.198131 |
| 4.05 | −0.268975 | 0.203897 |
| 4.10 | −0.274851 | 0.209749 |
| 4.15 | −0.280858 | 0.215612 |
| 4.20 | −0.287011 | 0.221454 |
| 4.25 | −0.293322 | 0.227263 |
| 4.30 | −0.299792 | 0.233044 |
| 4.35 | −0.306422 | 0.238808 |
| 4.40 | −0.313206 | 0.244572 |
| 4.45 | −0.320137 | 0.250349 |
| 4.50 | −0.327206 | 0.256151 |
| 4.55 | −0.334404 | 0.261986 |
| 4.60 | −0.341723 | 0.267862 |
| 4.65 | −0.349154 | 0.273785 |
| 4.70 | −0.356690 | 0.279757 |
| 4.75 | −0.364326 | 0.285782 |
| 4.80 | −0.372057 | 0.291863 |
| 4.85 | −0.379879 | 0.298001 |
| 4.90 | −0.387790 | 0.304198 |
| 4.95 | −0.395789 | 0.310454 |
| 5.00 | −0.403874 | 0.316770 |
| 5.05 | −0.412043 | 0.323148 |
| 5.10 | −0.420298 | 0.329587 |
| 5.15 | −0.428636 | 0.336088 |
| 5.20 | −0.437058 | 0.342652 |
| 5.25 | −0.445565 | 0.349279 |
| 5.30 | −0.454155 | 0.355969 |
| 5.35 | −0.462829 | 0.362722 |
| 5.40 | −0.471587 | 0.369539 |
| 5.45 | −0.480430 | 0.376419 |
| 5.50 | −0.489356 | 0.383363 |
| 5.55 | −0.498366 | 0.390371 |
| 5.60 | −0.507461 | 0.397443 |
| 5.65 | −0.516640 | 0.404579 |
| 5.70 | −0.525904 | 0.411779 |
| 5.75 | −0.535251 | 0.419044 |
| 5.80 | −0.544684 | 0.426373 |
| 5.85 | −0.554201 | 0.433766 |
| 5.90 | −0.563802 | 0.441225 |
| 5.95 | −0.573489 | 0.448747 |
| 6.00 | −0.583260 | 0.456335 |

Figure 6:
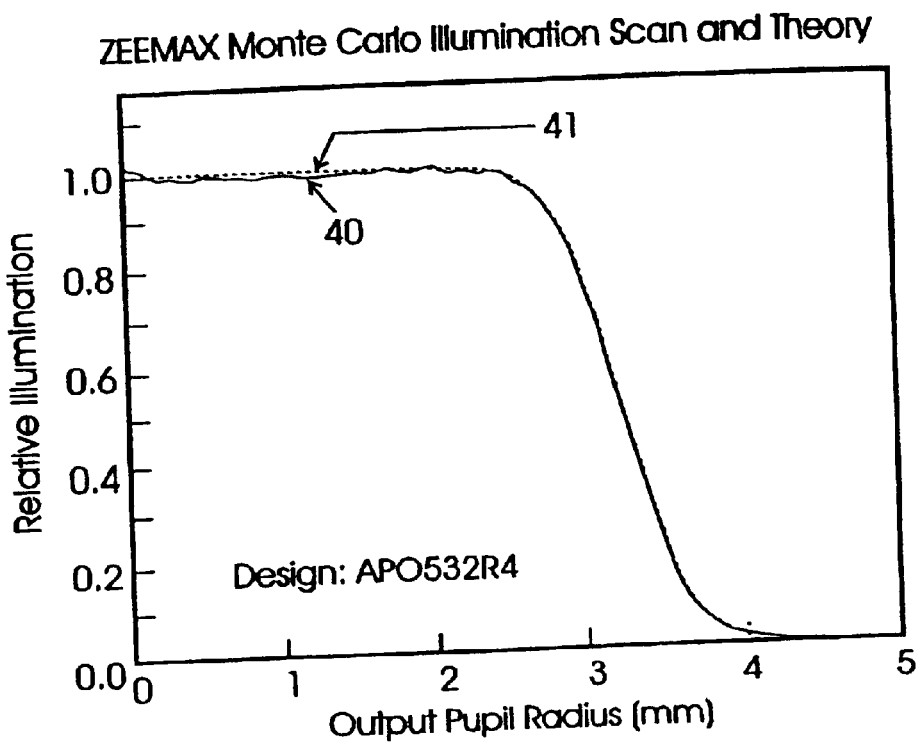
FIG. 6 is a graph showing an output intensity profile calculated by ray-tracing a large number of randomly selected input rays (points) in comparison to a desired Fermi-Dirac profile (line)

The output intensity distribution for the lens configuration of Table I was checked using a Monte-Carlo ray-tracing technique. The result, shown in FIG. 6, provides independent confirmation that the optical design of the present invention does affect the desired intensity redistribution. FIG. 6 shows an output intensity profile calculated using a Monte-Carlo scan by ray-tracing a large number of randomly selected input rays (points) 40 in comparison to a desired Fermi-Dirac profile (line) 41.

Use of a material having low dispersion, such as fused silica, provides an important advantage in that the design is near achromatic. Calculations show that by providing an adjustable spacing between the two lenses, the prescription of Table I generates a diffraction-limited, collimated output beam over the entire wavelength range from 257 nm to 1550 nm. The shape of the output intensity distribution changes only slightly as the wavelength is changed from the design value of 532 nm, but a large, uniform central region (analogous to the region 20) is always present. Thus, only a single pair of lenses needs to be fabricated for use with any light source within this spectral range.

Figure 7:
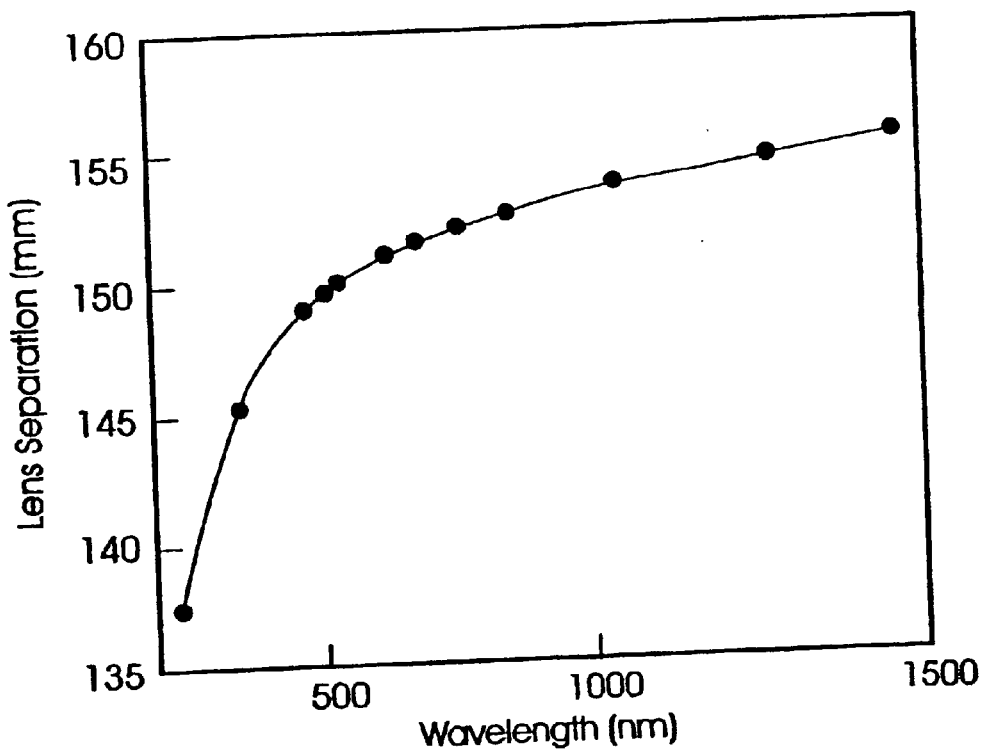
FIG. 7 is a graph showing lens spacing as a function of wavelength for optimum performance according to the present invention.

FIG. 7 shows the required spacing between the two aspheric surfaces as a function of wavelength. The design procedure is applicable at any wavelength for which transparent materials exist, including the deep ultraviolet and far infrared regions, both of which are of technological importance.

Tolerancing calculations indicate that the design of the present invention does not place unreasonable demands on surface accuracy or positioning of the components. In practice, the shape of the laser beam may deviate from an ideal Gaussian distribution, so it is also important to consider the effect that such a deviation has on the output of the optical system of the present invention. Suppose that the optics have been fabricated according to the design described above, but that instead of the nominal input distribution f(r), the light source is actually described by some modified distribution $f_1(r)$. Consequently, the output intensity distribution is modified to $g_1(R)$. Energy conservation provides that the modified functions satisfy $$\int_0^r f_1(s)s\,ds = \int_0^R g_1(s)s\,ds, \qquad (22)$$

where r and R are related by the ray-tracing function of Eq. (15). Differentiating Eqs. (15) and (22) with respect to R yields $$g_1(R)=g(R)f_1(r)/f(r). \qquad (23)$$

This result takes a particularly simple form for the case in which the input beam is Gaussian and has a beam waist parameter $w_1$ that deviates from the design value w. Then, Eq. (23) reduces to $$g_1=g(R)(w/w_1)^2\, e^{-2r^2(w_1^{-2}-w^{-2})}. \qquad (24)$$

This means that if a uniformity is required to exceed some value U, then the beam waist parameter must be controlled to a tolerance $(1-U)/2$ for the optics to function without appreciable loss of efficiency.

Another important consideration for practical applications is the range over which the beam retains its uniform intensity. Assume that a plane wave is generated having the desired intensity distribution at the output pupil. In the ray-optics approximation, the resulting output beam would propagate forever without changing its shape. Diffraction, in fact, modifies the intensity distribution, resulting in a beam that becomes less uniform as it propagates. Diffraction is ignored in designs that strive for a sharp cutoff, such as the intensity distribution of Eq. (8). Effects of diffraction in the far-field limit can be estimated by applying Kirchoff's theory of diffraction together with the paraxial approximation. If the amplitude of the optical field at the output aperture of the beam reshaper is denoted u(r), then after propagating a distance D, the amplitude at a distance x from the beam axis is given by $$u(x,D) = \int_0^{r_p} \rho u(\rho) J_0(k\rho x/D) e^{ik\rho^2/2D} d\rho, \qquad (25)$$

where $r_p$ denotes the exit pupil radius, $k=2\pi/\lambda$ is the wavenumber of the light, and $J_0$ is the Bessel function of order 0.

Evaluating the Kirchoff integral for a plane wave having a Fermi-Dirac intensity distribution and the shape parameters given in Eqs. (20) and (21), and assuming a wavelength of 532 nm, the useful range of the beam described above is found to be of order 1 to 2 m, depending on the required uniformity tolerance. This is fully adequate for many laboratory and industrial applications. If, however, the output intensity distribution falls off too rapidly, the effects of diffraction become much more severe. For instance, if w in the exemplary design of Table I described above is reduced by an order of magnitude, leaving the rest of the design the same, then diffraction severely distorts the beam shape after less than 20 cm.

Figure 8:
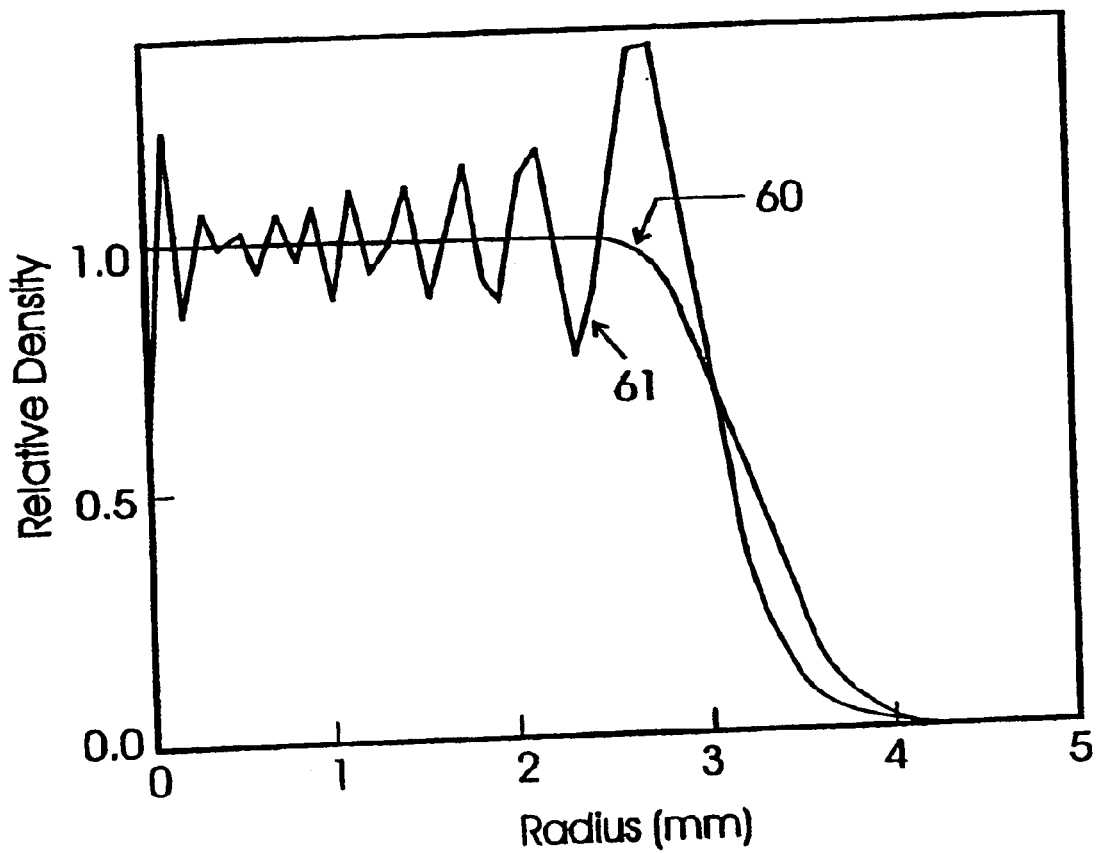
FIG. 8 is a graph showing the relative intensity distributions for two Fermi-Dirac distributions having $R_0=3.25$ mm after propagating 1 m.

Eq. (25) was evaluated numerically for D=1 m and a wavelength of 532 nm, with u(r) being the square root of the intensity function for each of the two Fermi-Dirac functions, with $R_0$=3.25 mm and W=0.2 mm (rounded roll-off). The resulting u(x,D) was squared for obtaining the diffracted intensity distributions shown. FIG. 8 shows the relative intensity distributions for two Fermi-Dirac distributions having $R_0$=3.25 mm after propagating 1 m. Smooth curve 60 corresponds to W=0.2 mm, and is virtually indistinguishable for the initial Fermi-Dirac function. Oscillating curve 61 corresponds to W=0.02 mm, and shows oscillations of up to 40% about the nominal intensity. Thus, FIG. 8 shows the importance of controlling the output intensity roll-off when the range over which uniform illumination is maintained is a concern.

An advantage of preferred embodiments herein is that they produce a collimated flattop beam, i.e., a beam that retains its intensity profile as it propagates. The constancy of the beam profile is an important consideration for many useful applications, including projection optics (e.g., displays and lithographic tools) with variable working distance, and laser amplifiers in which the beam propagates through a long gain medium. Consequently, it is highly desirable to maximize the range over which the beam retains its flattop profile.

To make this notion quantitative, the useful range of the output beam can be defined as the distance d over which some predetermined fraction of the total input power is enclosed in a region in which the power varies by less than some predetermined tolerance. As previously noted, diffraction places a fundamental limit on d. The present invention provides a technique for designing an output beam having a controlled roll-off, such as by choosing a Fermi-Dirac or super-Gaussian profile, for reducing the effects of diffraction to any desired degree. In practice, the useful range of the output beam is often limited not by diffraction, but by imperfections in the fabrication of the aspheric surfaces making up the Gaussian to flattop converter. Specifically, it is often difficult to maintain the desired surface figure in the immediate neighborhood of the optical axis to a precision better than approximately 100 nm. Such a small deviation of the fabricated surfaces from an intended shape can have a surprisingly deleterious effect on the performance of the optical system, and particularly on the profile of the beam as it propagates.

Experimentally, it is observed that immediately after the exit aperture of the optical system the beam has very nearly the desired intensity distribution. As the beam propagates, though, a "hole" or region of abnormally low intensity, develops in the center region of the beam. Other deviations from an ideal profile may also be encountered, but the "hole" is usually the most prominent aberration. The origin of such an effect is caused by imperfections of the optical elements, and may be understood simply in terms of ray optics, as follows. If the lenses were perfect, all rays would exit the optical system parallel to the optical axis. The effect of deviations of the fabricated surfaces from the ideal figure is that rays exit the system at some small angle dq to the optical axis. Suppose for simplicity that near the optical axis, the angle dq is constant. (This assumption is not essential.) After propagating a distance b=a/dq, all of the rays within radius a of the optical axis will have diverged from the axis by at least the distance a, and there will be a "hole" of radius a in the intensity distribution.

The useful range of the Gaussian-to-flattop optics can be dramatically improved if a system of aspherical lenses for transforming the input beam is followed by a beam expander of magnification M>1. This is a widely used optical device, which in its simplest implementation is constructed from two spherical lenses having respective focal lengths $f_1$ and $f_2$ in a confocal arrangement, i.e., separated by a distance equal to $f_1+f_2$. The output lens $f_2$ is positive, while the input lens $f_1$ may be either positive or negative.

The effect of the expander is to transform an incoming beam into an outgoing beam in which linear dimensions are expanded by the factor $M=|f_2/f_1|$, while angular deviations are reduced by the factor M. Of course more elaborate implementations are possible without changing the essential idea. Referring to the foregoing discussion of the effects of figure error, it can be seen that because the beam expander reduces dq by a factor of M, the radius of the "hole" (in absolute dimensions) that evolves after the beam has propagated some given distance is smaller by a factor of M than for the unexpanded beam. Moreover, because the linear dimensions of the beam itself have been increased by a factor M, the size of the "hole" relative to the total beam size is reduced by a factor $M^2$, and the fractional intensity that is affected is reduced by $M^4$. If, instead, the distance that the beam propagates before the "hole" has a given size relative to the beam diameter is considered, it is easy to see that the beam expander increases the range by a factor of $M^2$. From these considerations, it is clear that even a modest value of M can greatly increase the useful range of the output beam.

Note that although a rather simple model of the evolution of a "hole" in the center of the beam has been considered, the argument applies quite generally to any departure of the beam profile from the desired form that can be described in terms of ray optics as being due to an error in the propagation direction of the output rays. This is because a general property of a beam expander is that it magnifies linear dimensions and demagnifies angular dimensions both by the same factor M.

Figure 9:
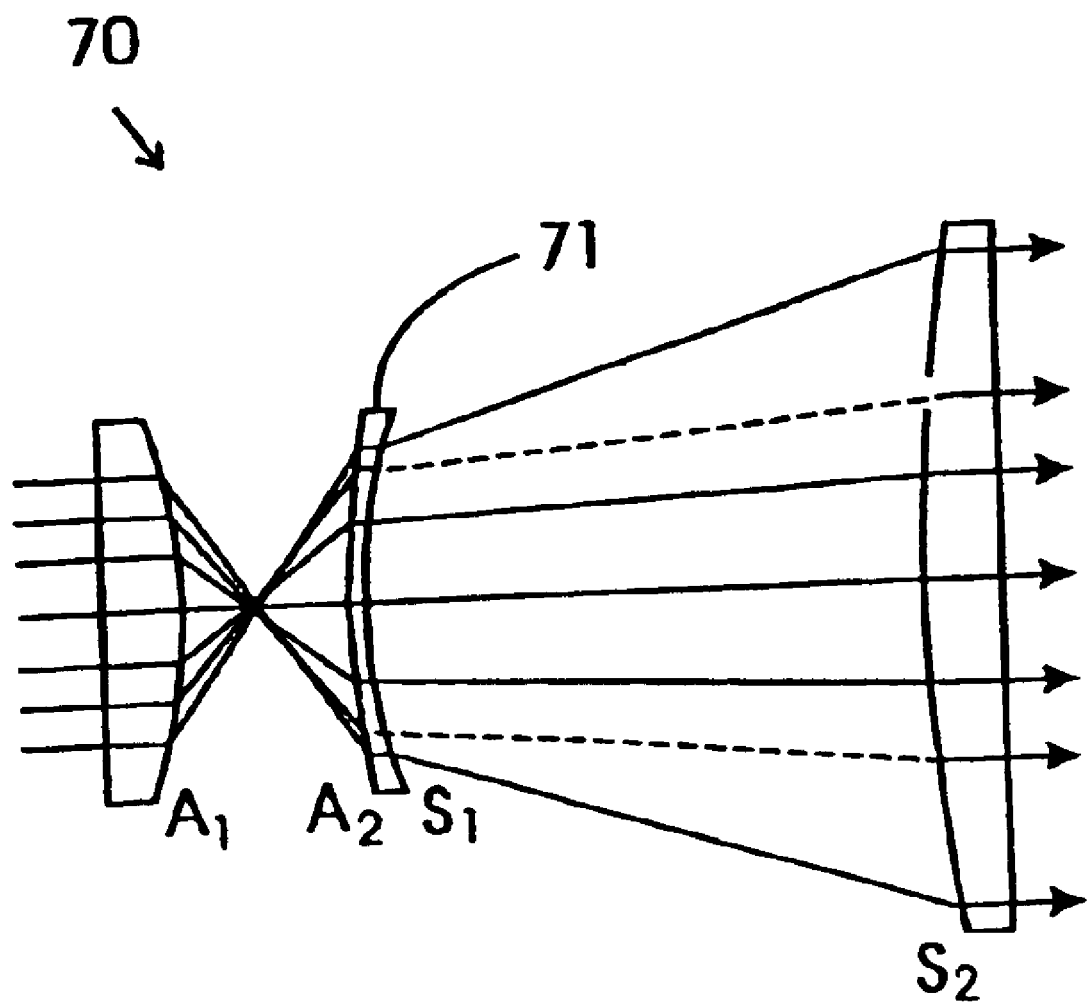
FIG. 9 shows an optical system having the aspherical optics of the present invention integrated with a beam expander.

Because some degree of imperfection is inherent in the fabrication of all optical elements, with aspherical surfaces being especially difficult to fabricate, it is advantageous when designing a system for uniform illumination to follow the aspherical Gaussian-to-flattop optics by a beam expander that reduces the effects of fabrication errors and increases the useful range of the output beam, as described above. The aspherical optics and the beam expander can be integrated, as shown in FIG. 9 as optical system 70. Such a configuration has the advantage of simplifying optical alignment and minimizing the distance that the beam propagates between the aspherical system and the beam expander.

In FIG. 9, surfaces $A_1$ and $A_2$ denote the aspherical surfaces that convert a collimated Gaussian beam to a collimated flattop beam, as described above. Surfaces $S_1$ and $S_2$ are spherical surfaces that together form a beam expander of magnification M. Optical element 71 performs the function both of the output lens of the Gauss-to-flattop converter and the input lens of the beam expander. FIG. 9 is drawn with $S_1$ shown as concave (i.e., the beam expander is shown having $f_1<0$), but as explained above, $S_1$ can also be convex ($f_1>0$), in which case there would be an intermediate focus located between the second and third optical elements. The second optical element can be fabricated by sequentially polishing the surfaces $A_2$ and $S_1$, or by joining two separately ground and polished elements using an optical adhesive or optical contact.

Tables II and III below describe two other exemplary embodiments, in which the lenses are arranged as illustrated in FIGS. 1B and 1A, respectively (with the aspheric surfaces facing each other). Table II represents an optical prescription for a two lens Galilean system that includes two monotonic (non-reentrant) surfaces having axial symmetry. The input and output beams were like those used in the embodiment of Table I, namely, the input beam intensity profile was taken to be Gaussian and the output beam intensity profile was chosen to be a Fermi-Dirac distribution, using the parameters of eqs. 18–21. The design wavelength was 532 nm, the index of refraction of the lenses was 1.460706 (fused silica), the separation between the aspheric surfaces along the optical axis was 150 mm, and the radius of the clear aperture of each of the two lenses was 4.050 mm. The resulting sag values for z(r) (Asphere I) and Z(R) (Asphere II) are presented in Table II.

Table III, which includes Tables IIIA and IIIB, describes a two lens optical prescription for transforming an input Gaussian beam to an output rectangular beam, specifically, a super-Gaussian as given by:

$$I(x,y)=I_0 \, e^{-2(x/x_0)^p} \, e^{-2(y/y_0)^p} \tag{26}$$

In this example, p=10, and $x_0$=8.655 mm, $y_0$=4.327 mm. Table IIIA describes the optical element that receives the input beam, whereas Table IIIB describes the optical element away from which the output beam propagates. The separation between the aspheric surfaces along the optical axis was chosen to be 250 mm, and the index of refraction was 1.4285 (corresponding to $CaF_2$ at a wavelength of 1064 nm). The beam reshaper of Tables IIIA and IIIB is designed to transform a Gaussian having a beam waist of $w_0$=2.887 mm, with the $e^{-6}$ power point of such a Gaussian being at r=5 mm (which is taken to be the radius of the clear aperture of the optical element described by Table IIIA). With respect to the output beam, the values for $X_0$ and $Y_0$ (see eq. 26) were selected with a 12 mm×6 mm rectangular output region in mind, for which the uniformity U over this rectangular region was at least 90%. To achieve this uniformity with the given input Gaussian beam, its beam waist wo would have to be increased to 29.2 mm; this corresponds to an order of magnitude worse power utilization than the beam reshaper represented by Tables IIIA and IIIB. The sag values for $z_x(x)$ and $z_y(y)$ (see eq. 11) corresponding to the first optical element are presented in the second and third columns of Table IIIA, respectively. (The first column gives the corresponding x and y values.) The resulting sag values for $Z_X(X)$ and $Z_Y(Y)$ (see eq. 12) corresponding to the second optical element are presented in the second and fourth columns of Table IIIB, respectively (with the first and third columns giving the corresponding x and y values, respectively.) In preferred implementations, the output beam from optical systems herein may be used in a variety of applications. The output beam may be directed onto material in a materials processing application, or it may be directed onto photolithographic material in a photolithography application. The output beam may also be directed into optical fiber through one or more optical elements such as lenses for optical communications applications, especially in the near infrared from 1.3–1.6 microns. For example, a linear or 2-D array of optical elements such as lenses may be used in the parallel processing of multiple optical beams, for instance, in optical switching devices.

The optical systems herein may be advantageously employed in the illumination of an extended spatial region whenever both uniformity of illumination and efficient use of laser power are required. Preferred implementations thereof include using the output beams herein in a photochemical process, in a nonlinear optical process (e.g., optical limiting or harmonic generation, such as directing the output beam into a frequency doubling crystal or a gas), injection of the output beam into a laser or laser amplifier, and the illumination of reflective or selectively reflective surfaces such as spatial light modulators in projection displays.

In other preferred embodiments of the invention, there is provided media encoded with executable program code to effect any of the optical design methods described herein. These media may include a magnetic or optical disk or diskette, for example. In preferred embodiments, this program code may be read by a digital processing apparatus such as a computer for performing any one or more of the methods disclosed herein.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

TABLE II

| r, R | z(r) | Z(R) |
|---|---|---|
| 0.000000 | 0.000000 | 0.000000 |
| 0.050000 | 0.000017 | 0.000009 |
| 0.100000 | 0.000069 | 0.000035 |
| 0.150000 | 0.000155 | 0.000079 |
| 0.200000 | 0.000275 | 0.000141 |
| 0.250000 | 0.000429 | 0.000221 |
| 0.300000 | 0.000617 | 0.000318 |
| 0.350000 | 0.000837 | 0.000432 |
| 0.400000 | 0.001089 | 0.000564 |
| 0.450000 | 0.001373 | 0.000714 |
| 0.500000 | 0.001688 | 0.000881 |
| 0.550000 | 0.002032 | 0.001065 |
| 0.600000 | 0.002406 | 0.001266 |
| 0.650000 | 0.002808 | 0.001485 |
| 0.700000 | 0.003236 | 0.001721 |
| 0.750000 | 0.003691 | 0.001974 |
| 0.800000 | 0.004170 | 0.002243 |
| 0.850000 | 0.004672 | 0.002530 |
| 0.900000 | 0.005197 | 0.002833 |
| 0.950000 | 0.005742 | 0.003153 |
| 1.000000 | 0.006306 | 0.003489 |
| 1.050000 | 0.006888 | 0.003841 |
| 1.100000 | 0.007486 | 0.004210 |
| 1.150000 | 0.008099 | 0.004594 |
| 1.200000 | 0.008726 | 0.004994 |
| 1.250000 | 0.009364 | 0.005410 |
| 1.300000 | 0.010012 | 0.005841 |
| 1.350000 | 0.010669 | 0.006287 |
| 1.400000 | 0.011334 | 0.006748 |
| 1.450000 | 0.012003 | 0.007223 |
| 1.500000 | 0.012677 | 0.007713 |
| 1.550000 | 0.013354 | 0.008217 |
| 1.600000 | 0.014031 | 0.008735 |
| 1.650000 | 0.014709 | 0.009266 |
| 1.700000 | 0.015384 | 0.009810 |
| 1.750000 | 0.016057 | 0.010367 |
| 1.800000 | 0.016726 | 0.010936 |
| 1.850000 | 0.017389 | 0.011517 |
| 1.900000 | 0.018046 | 0.012109 |
| 1.950000 | 0.018695 | 0.012713 |
| 2.000000 | 0.019335 | 0.013326 |
| 2.050000 | 0.019966 | 0.013950 |
| 2.100000 | 0.020587 | 0.014582 |
| 2.150000 | 0.021196 | 0.015224 |
| 2.200000 | 0.021793 | 0.015873 |
| 2.250000 | 0.022377 | 0.016529 |
| 2.300000 | 0.022948 | 0.017191 |
| 2.350000 | 0.023506 | 0.017858 |
| 2.400000 | 0.024048 | 0.018530 |
| 2.450000 | 0.024576 | 0.019205 |
| 2.500000 | 0.025089 | 0.019882 |
| 2.550000 | 0.025586 | 0.020560 |
| 2.600000 | 0.026066 | 0.021237 |
| 2.650000 | 0.026531 | 0.021911 |
| 2.700000 | 0.026979 | 0.022583 |
| 2.750000 | 0.027411 | 0.023248 |
| 2.800000 | 0.027825 | 0.023906 |
| 2.850000 | 0.028223 | 0.024554 |
| 2.900000 | 0.028604 | 0.025191 |
| 2.950000 | 0.028967 | 0.025814 |
| 3.000000 | 0.029313 | 0.026420 |
| 3.050000 | 0.029642 | 0.027008 |
| 3.100000 | 0.029954 | 0.027574 |
| 3.150000 | 0.030249 | 0.028117 |
| 3.200000 | 0.030527 | 0.028634 |
| 3.250000 | 0.030787 | 0.029123 |
| 3.300000 | 0.031031 | 0.029583 |

TABLE II-continued

| r, R | z(r) | Z(R) |
|---|---|---|
| 3.350000 | 0.031258 | 0.030012 |
| 3.400000 | 0.031468 | 0.030410 |
| 3.450000 | 0.031662 | 0.030775 |
| 3.500000 | 0.031839 | 0.031107 |
| 3.550000 | 0.032000 | 0.031406 |
| 3.600000 | 0.032145 | 0.031674 |
| 3.650000 | 0.032274 | 0.031909 |
| 3.700000 | 0.032387 | 0.032114 |
| 3.750000 | 0.032485 | 0.032288 |
| 3.800000 | 0.032567 | 0.032433 |
| 3.850000 | 0.032634 | 0.032550 |
| 3.900000 | 0.032687 | 0.032639 |
| 3.950000 | 0.032724 | 0.032703 |
| 4.000000 | 0.032747 | 0.032741 |
| 4.050000 | 0.032756 | 0.032756 |

TABLE IIIA

| x, y | $z_x$ | $z_y$ |
|---|---|---|
| 0.000000 | 0.000000 | 0.000000 |
| 0.100000 | −0.000245 | −0.000146 |
| 0.200000 | −0.000978 | −0.000582 |
| 0.300000 | −0.002197 | −0.001309 |
| 0.400000 | −0.003897 | −0.002322 |
| 0.500000 | −0.006072 | −0.003619 |
| 0.600000 | −0.008713 | −0.005197 |
| 0.700000 | −0.011810 | −0.007049 |
| 0.800000 | −0.015351 | −0.009170 |
| 0.900000 | −0.019325 | −0.011555 |
| 1.000000 | −0.023718 | −0.014196 |
| 1.100000 | −0.028515 | −0.017085 |
| 1.200000 | −0.033700 | −0.020217 |
| 1.300000 | −0.039259 | −0.023582 |
| 1.400000 | −0.045175 | −0.027173 |
| 1.500000 | −0.051433 | −0.030982 |
| 1.600000 | −0.058018 | −0.035001 |
| 1.700000 | −0.064913 | −0.039223 |
| 1.800000 | −0.072107 | −0.043642 |
| 1.900000 | −0.079585 | −0.048250 |
| 2.000000 | −0.087334 | −0.053041 |
| 2.100000 | −0.095344 | −0.058009 |
| 2.200000 | −0.103603 | −0.063149 |
| 2.300000 | −0.112102 | −0.068457 |
| 2.400000 | −0.120831 | −0.073927 |
| 2.500000 | −0.129783 | −0.079556 |
| 2.600000 | −0.138950 | −0.085339 |
| 2.700000 | −0.148324 | −0.091273 |
| 2.800000 | −0.157900 | −0.097356 |
| 2.900000 | −0.167672 | −0.103583 |
| 3.000000 | −0.177635 | −0.109953 |
| 3.100000 | −0.187783 | −0.116464 |
| 3.200000 | −0.198113 | −0.123112 |
| 3.300000 | −0.208619 | −0.129896 |
| 3.400000 | −0.219299 | −0.136814 |
| 3.500000 | −0.230149 | −0.143864 |
| 3.600000 | −0.241166 | −0.151044 |
| 3.700000 | −0.252346 | −0.158354 |
| 3.800000 | −0.263688 | −0.165791 |
| 3.900000 | −0.275188 | −0.173355 |
| 4.000000 | −0.286843 | −0.181044 |
| 4.100000 | −0.298653 | −0.188857 |
| 4.200000 | −0.310614 | −0.196793 |
| 4.300000 | −0.322724 | −0.204851 |
| 4.400000 | −0.334983 | −0.213030 |
| 4.500000 | −0.347387 | −0.221329 |
| 4.600000 | −0.359936 | −0.229747 |
| 4.700000 | −0.372628 | −0.238284 |
| 4.800000 | −0.385461 | −0.246939 |
| 4.900000 | −0.398434 | −0.255711 |
| 5.000000 | −0.411546 | −0.264600 |

TABLE IIIB

| X | $Z_X$ | Y | $Z_Y$ |
|---|---|---|---|
| 0.000000 | 0.000000 | 0.000000 | 0.000000 |
| 0.184986 | 0.000197 | 0.092482 | 0.000059 |
| 0.369972 | 0.000789 | 0.184964 | 0.000235 |
| 0.554957 | 0.001776 | 0.277447 | 0.000529 |
| 0.739943 | 0.003158 | 0.369929 | 0.000940 |
| 0.924929 | 0.004935 | 0.462411 | 0.001469 |
| 1.109915 | 0.007107 | 0.554893 | 0.002116 |
| 1.294901 | 0.009676 | 0.647376 | 0.002881 |
| 1.479887 | 0.012640 | 0.739858 | 0.003764 |
| 1.664872 | 0.016001 | 0.832340 | 0.004766 |
| 1.849858 | 0.019760 | 0.924822 | 0.005887 |
| 2.034844 | 0.023917 | 1.017305 | 0.007127 |
| 2.219830 | 0.028472 | 1.109787 | 0.008486 |
| 2.404816 | 0.033427 | 1.202269 | 0.009966 |
| 2.589802 | 0.038782 | 1.294751 | 0.011566 |
| 2.774787 | 0.044539 | 1.387233 | 0.013288 |
| 2.959773 | 0.050699 | 1.479716 | 0.015131 |
| 3.144759 | 0.057263 | 1.572198 | 0.017096 |
| 3.329745 | 0.064233 | 1.664680 | 0.019185 |
| 3.514731 | 0.071609 | 1.757162 | 0.021398 |
| 3.699717 | 0.079395 | 1.849645 | 0.023736 |
| 3.884702 | 0.087591 | 1.942127 | 0.026200 |
| 4.069688 | 0.096201 | 2.034609 | 0.028791 |
| 4.254674 | 0.105226 | 2.127091 | 0.031510 |
| 4.439660 | 0.114669 | 2.219573 | 0.034360 |
| 4.624646 | 0.124533 | 2.312056 | 0.037341 |
| 4.809632 | 0.134822 | 2.404538 | 0.040455 |
| 4.994617 | 0.145539 | 2.497020 | 0.043704 |
| 5.179603 | 0.156689 | 2.589502 | 0.047090 |
| 5.364589 | 0.168276 | 2.681985 | 0.050616 |
| 5.549575 | 0.180306 | 2.774467 | 0.054284 |
| 5.734561 | 0.192784 | 2.866949 | 0.058098 |
| 5.919547 | 0.205716 | 2.959431 | 0.062061 |
| 6.104532 | 0.219112 | 3.051914 | 0.066177 |
| 6.289518 | 0.232978 | 3.144396 | 0.070449 |
| 6.474504 | 0.247325 | 3.236878 | 0.074884 |
| 6.659490 | 0.262163 | 3.329360 | 0.079486 |
| 6.844476 | 0.277504 | 3.421842 | 0.084262 |
| 7.029462 | 0.293361 | 3.514325 | 0.089218 |
| 7.214447 | 0.309751 | 3.606807 | 0.094363 |
| 7.399433 | 0.326691 | 3.699289 | 0.099705 |
| 7.584419 | 0.344198 | 3.791771 | 0.105254 |
| 7.769405 | 0.362296 | 3.884254 | 0.111022 |
| 7.954391 | 0.381008 | 3.976736 | 0.117020 |
| 8.139377 | 0.400361 | 4.069218 | 0.123262 |
| 8.324362 | 0.420385 | 4.161700 | 0.129763 |
| 8.509348 | 0.441112 | 4.254183 | 0.136541 |
| 8.694334 | 0.462578 | 4.346665 | 0.143614 |
| 8.879320 | 0.484822 | 4.439147 | 0.151002 |
| 9.064306 | 0.507887 | 4.531629 | 0.158726 |
| 9.249292 | 0.531820 | 4.624111 | 0.166811 |

What is claimed is:

1. A method of transforming a beam of electromagnetic radiation, comprising:
   providing at least one optical element that includes a first and a second aspherical, non-planar, non-reentrant surface;
   directing an input optical beam of substantially non-uniform intensity onto the first surface, wherein the intensity profile of the input beam is expressible as a first function of a first coordinate times a second function of a second coordinate, the first and second coordinates being independent of each other, and wherein each of the surface has a sag value that is expressible as a sum of contributions that depend on the first and second coordinates, respectively; and
   transforming substantially all of the input beam into an output beam that propagates away from the second surface, said aspherical surfaces selected to perform said transforming, wherein the output beam includes a central region over which the optical intensity is substantially uniform, the central region including most of the optical power in the output beam, the intensity of the output beam outside the region varying gradually to substantially reduce diffraction effects.

2. The method of claim 1, wherein said at least one optical element includes a first and a second optical element, each of the first and the second optical elements having at least one aspherical, non-planar, non-reentrant surface, the method further comprising aligning the first and the second optical elements along an optical axis.

3. The method of claim 1, wherein:
   the first and second coordinates are orthogonal spatial coordinates; and
   the intensity of the output beam outside the central region varies gradually to substantially reduce diffraction effects.

4. A method of designing an optical system for transforming a first optical beam to a second optical beam, the first and second optical beams having respective intensity profiles, comprising:
   expressing the intensity profile of the first optical beam as a first function times a second function;
   expressing the intensity profile of the second optical beam as a third function times a fourth function, wherein each of the first and third functions are functions of a first spatial coordinate, each of the second and fourth functions are functions of a second spatial coordinate, and the first and the second spatial coordinates are orthogonal to each other;
   defining an optical axis along a spatial coordinate orthogonal to the first and second spatial coordinates along which two aspherical, non-planar, non-reentrant surfaces are to be aligned;
   constructing a ray-tracing function for the first spatial coordinate using the first and third functions;
   constructing a ray-tracing function for the second spatial coordinate using the second and fourth functions; and
   using the ray-tracing functions to calculate sag values for each of the surfaces, wherein each sag value is expressible as a sum of contributions that depend on the first and second spatial coordinates, respectively.

5. The method of claim 4, wherein the first and the second surfaces form part of first and second optical elements respectively.

6. The method of claim 4, wherein the surfaces are arranged in a Keplerian configuration.

7. The method of claim 4, wherein the surfaces are arranged in a Galilean configuration.

8. The method of claim 4, wherein the first optical beam is substantially non-uniform.

9. The method of claim 4, wherein the first optical beam is Gaussian.

10. The method of claim 4, wherein the intensity profile of the second optical beam is substantially rectangular.

11. The method of claim 4, wherein the intensity profile of the second optical beam is substantially uniform.

12. The method of claim 4, the second output beam has an intensity distribution selected from the distributions consisting of Fermi-Dirac, super Gaussian, and flattened Gaussian.

13. The method of claim 4, wherein the integrated intensity of the second output beam is at least 90% that of the first optical beam.

14. The method of claim 4, further comprising manufacturing the optical system.

15. The method of claim 1, wherein the first mid second coordinates are polar coordinates.

16. The method of claim 1, wherein the first and second coordinates are orthogonal spatial coordinates.

17. The method of claim 1, wherein intensity profile of the output-beam is substantially coordinates.

18. The method of claim 1, wherein substantially all of the input beam is transformed for any wavelength within the wavelength range extending from 257 nm to 1550 nm.

19. The method of claim 1, wherein the first mid second coordinates are represented by the Cartesian coordinates x and y, respectively, and each of the non-reentrant surfaces has a two-dimensional sag curve of the km $z(x,y)=z(x)+z(y)$.

20. The method of claim 1, wherein the aspherical surfaces have deviations from sphericity of less than about 20 micrometers.

21. The method of claim 1, wherein each of the non-reentrant surface has a sag curve that varies monotonically in the radial direction away from an optical axis along which the non-reentrant surfaces are aligned.

22. The method of claim 1, wherein each of the non-reentrant surfaces has an optical prescription that is given by a single integral equation.

23. The method of claim 4, wherein the intensity of the second beam is substantially rectangular.

24. The method of claim 4, wherein the aspherical surfaces have deviations from sphericity of less than about 20 micrometers.

* * * * *

UNITED STATES PATENT AND TRADEMARK OFFICE
CERTIFICATE OF CORRECTION

PATENT NO.    : 6,801,368 B2
DATED         : October 5, 2004
INVENTOR(S)   : Hans J. Coufal et al.

It is certified that error appears in the above-identified patent and that said Letters Patent is hereby corrected as shown below:

Column 1,
Replace equation (1) with:
-- $I(r) = (2P/\pi w^2)e^{-2r2/w2}$, --

Column 9,
Replace equation (7) with:
-- $f = (2/\pi w^2)e^{-2r2/w2} = (2/\pi w^2)e^{-2x2/w2} e^{-2y2/w2}$. --

Column 10,
Replace equation (12) with:
-- $Z_1(X,Y) = Z_x(X) + Z_y(Y)$ --

Column 15,
Replace equation (24) with:

-- $g_1 = g(R)(w/w_1)^2 e^{-2r^2(w_1^{-2} - w^{-2})}$. --

Column 22,
Line 58, after "claim4," insert -- wherein --
Line 60, replace "each of the surface" with -- each of the surfaces --
Line 70, replace "mid" with -- and --

Column 23,
Line 3, after "wherein insert -- the --
Line 4, replace "coordinates" with -- rectangular --
Line 8, replace "mid" with -- and --
Line 11, replace "km" with -- form --

UNITED STATES PATENT AND TRADEMARK OFFICE
CERTIFICATE OF CORRECTION

PATENT NO. : 6,801,368 B2
DATED : October 5, 2004
INVENTOR(S) : Hans J. Coufal et al.

It is certified that error appears in the above-identified patent and that said Letters Patent is hereby corrected as shown below:

Column 24,
Line 2, replace "surface" with -- surfaces --

Signed and Sealed this

First Day of March, 2005

JON W. DUDAS
*Director of the United States Patent and Trademark Office*

UNITED STATES PATENT AND TRADEMARK OFFICE
CERTIFICATE OF CORRECTION

PATENT NO. : 6,801,368 B2
APPLICATION NO. : 10/679058
DATED : October 5, 2004
INVENTOR(S) : Hans J. Coufal et al.

It is certified that error appears in the above-identified patent and that said Letters Patent is hereby corrected as shown below:

Column 1,
Replace equation (1) with:

-- $I(r) = (2P/\pi w^2)e^{-2r^2/w^2}$, --

Column 9,
Replace equation (7) with:

-- $f = (2/\pi w^2)e^{-2r^2/w^2} = (2/\pi w^2)e^{-2x^2/w^2}e^{-2y^2/w^2}$. --

Column 10,
Replace equation (12) with:
-- $Z_1(X,Y) = Z_x(X) + Z_y(Y)$ --

Column 15,
Replace equation (24) with:

-- $g_1 = g(R)(w/w_1)^2 e^{-2r^2(w_1^{-2} - w^{-2})}$. --

Column 21,
Line 60, replace "each of the surface" with -- each of the surfaces --

Column 22,
Line 58, after "claim4," insert -- wherein --
Line 66, replace "mid" with -- and --

Column 23,
Line 3, after "wherein insert -- the --
Line 4, replace "coordinates" with -- rectangular --
Line 8, replace "mid" with -- and --
Line 11, replace "km" with -- form --

UNITED STATES PATENT AND TRADEMARK OFFICE
CERTIFICATE OF CORRECTION

PATENT NO. : 6,801,368 B2
APPLICATION NO. : 10/679058
DATED : October 5, 2004
INVENTOR(S) : Hans J. Coufal et al.

It is certified that error appears in the above-identified patent and that said Letters Patent is hereby corrected as shown below:

Column 24,
Line 2, replace "surface" with -- surfaces --

This certificate supersedes Certificate of Correction issued March 1, 2005.

Signed and Sealed this

Eighth Day of August, 2006

JON W. DUDAS
*Director of the United States Patent and Trademark Office*